US011862475B2

(12) United States Patent
Ruan et al.

(10) Patent No.: US 11,862,475 B2
(45) Date of Patent: Jan. 2, 2024

(54) GAS MIXER TO ENABLE RPS PURGING

(71) Applicant: Applied Materials, Inc., Santa Clara, CA (US)

(72) Inventors: Fang Ruan, Milpitas, CA (US); Diwakar Kedlaya, San Jose, CA (US); Amit Bansal, Milpitas, CA (US); Venkata Sharat Chandra Parimi, Sunnyvale, CA (US); Rajaram Narayanan, Santa Clara, CA (US); Badri N. Ramamurthi, Los Gatos, CA (US); Sherry L. Mings, Sachse, TX (US); Job George Konnoth Joseph, Kerala (IN); Rupankar Choudhury, Agartala (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/071,618

(22) Filed: Oct. 15, 2020

(65) Prior Publication Data

US 2022/0122851 A1 Apr. 21, 2022

(51) Int. Cl.
*H01J 37/32* (2006.01)
*H01L 21/3213* (2006.01)
*H01L 21/3065* (2006.01)

(52) U.S. Cl.
CPC .... *H01L 21/32136* (2013.01); *H01L 21/3065* (2013.01); *H01J 37/32623* (2013.01)

(58) Field of Classification Search
CPC .......... H01L 21/32136; H01L 21/3065; H01L 21/6719; H01L 21/67196; H01L 21/67201;

(Continued)

(56) References Cited

U.S. PATENT DOCUMENTS

2008/0202416 A1* 8/2008 Provencher ....... C23C 16/45544
118/715
2016/0097119 A1* 4/2016 Cui ..................... C23C 16/4558
134/1.1

(Continued)

FOREIGN PATENT DOCUMENTS

KR 2005-0072291 A 7/2005
TW 202007791 A 2/2020
WO 2016-057180 A1 4/2016

OTHER PUBLICATIONS

International Search Report and Written Opinion dated Feb. 3, 2022 in International Patent Application No. PCT/US2021/054792, 9 pages.

*Primary Examiner* — Rudy Zervigon
(74) *Attorney, Agent, or Firm* — Kilpatrick Townsend & Stockton LLP

(57) ABSTRACT

A semiconductor processing system includes a remote plasma source (RPS), a faceplate, and an output manifold positioned between the RPS and the faceplate. The output manifold is characterized by a plurality of purge outlets that are fluidly coupled with a purge gas source and a plurality of deposition outlets that are fluidly coupled with a deposition gas source. A delivery tube extends between and fluidly couples the RPS and the faceplate. The delivery tube is characterized by a generally cylindrical sidewall that defines an upper plurality of apertures that are arranged in a radial pattern. Each of the upper apertures is fluidly coupled with one of the purge outlets. The generally cylindrical sidewall defines a lower plurality of apertures that are arranged in a radial pattern and below the upper plurality of apertures. Each of the lower apertures is fluidly coupled with one of the deposition outlets.

17 Claims, 11 Drawing Sheets

(58) Field of Classification Search
CPC ......... H01L 21/67173; H01L 21/67184; H01L 21/6776; H01L 21/67161; H01L 21/67155; H01J 37/32623; C23C 16/54; C23C 16/45551; C23C 16/545
USPC .................. 156/345.35, 345.31, 345.32; 118/723 MR, 723 ER, 719
See application file for complete search history.

(56) References Cited

U.S. PATENT DOCUMENTS

| | | |
|---|---|---|
| 2016/0168705 A1 | 6/2016 | Lind |
| 2017/0338134 A1* | 11/2017 | Tan ..................... H01L 21/3065 |
| 2018/0330951 A1 | 11/2018 | Kulshreshtha et al. |
| 2019/0376180 A1 | 12/2019 | Niskanen |
| 2020/0051825 A1* | 2/2020 | Salinas ............. H01L 21/02063 |
| 2021/0033197 A1* | 2/2021 | Riordon ............ H01L 21/67126 |

* cited by examiner

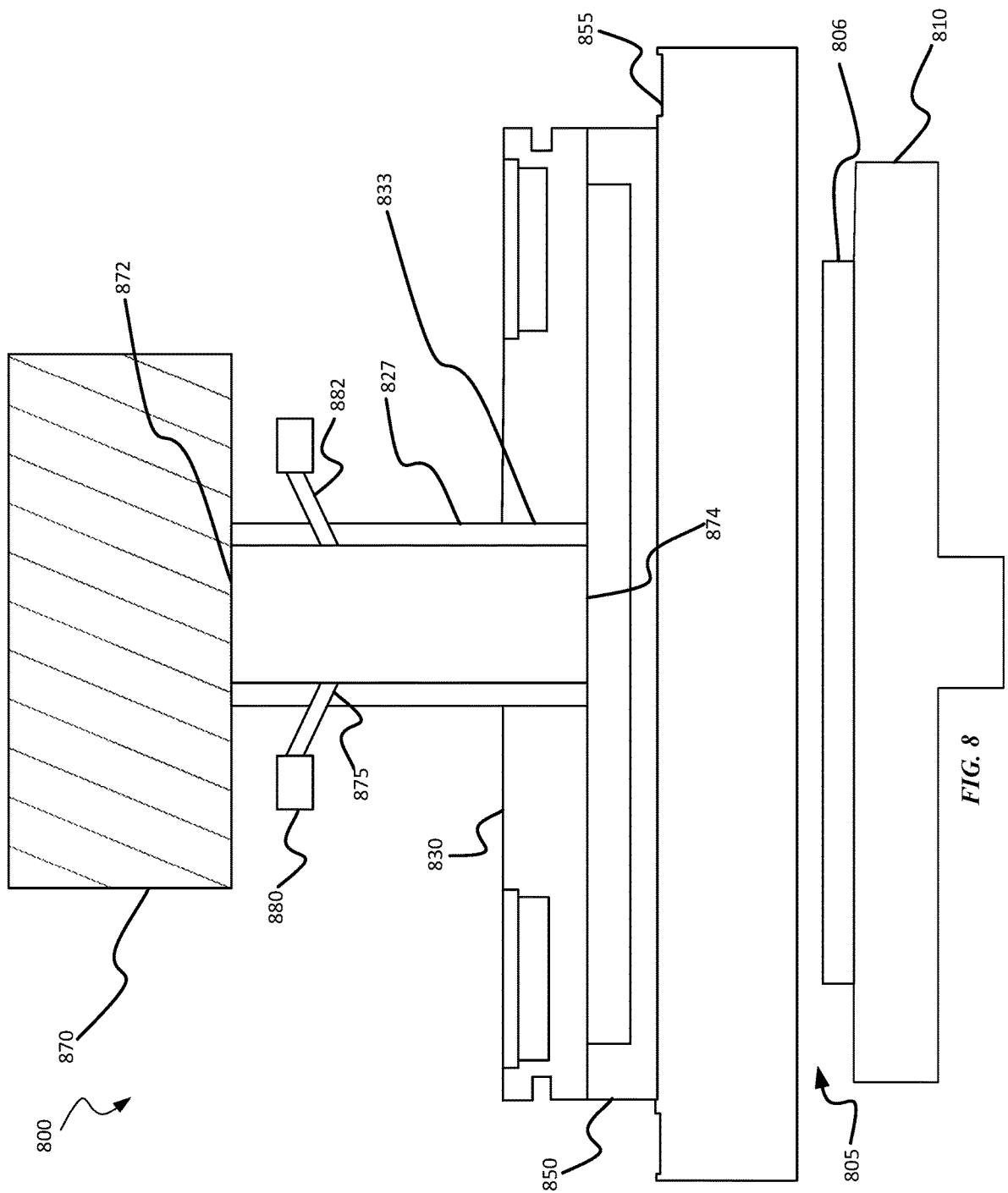

GAS MIXER TO ENABLE RPS PURGING

TECHNICAL FIELD

The present technology relates to components and apparatuses for semiconductor manufacturing. More specifically, the present technology relates to processing chamber distribution components and other semiconductor processing equipment.

BACKGROUND OF THE INVENTION

Integrated circuits are made possible by processes which produce intricately patterned material layers on substrate surfaces. Producing patterned material on a substrate requires controlled methods for forming and removing material. Chamber components often deliver processing gases to a substrate for depositing films or removing materials. To promote symmetry and uniformity, many chamber components may include regular patterns of features, such as apertures, for providing materials in a way that may increase uniformity. However, this may limit the ability to tune recipes for on-wafer adjustments.

Thus, there is a need for improved systems and methods that can be used to produce high quality devices and structures. These and other needs are addressed by the present technology.

BRIEF SUMMARY OF THE INVENTION

Exemplary semiconductor processing systems may include a remote plasma source (RPS). The systems may include a faceplate. The systems may include an output manifold positioned between the RPS and the faceplate. The output manifold may be characterized by a plurality of purge outlets that are fluidly coupled with a purge gas source and a plurality of deposition outlets that are fluidly coupled with a deposition gas source. The systems may include a delivery tube extending between and fluidly coupling the RPS and the faceplate. The delivery tube may be characterized by a generally cylindrical sidewall that defines an upper plurality of apertures that are arranged in a radial pattern. Each of the upper plurality of apertures may be fluidly coupled with at least one of the plurality of purge outlets. The generally cylindrical sidewall may define a lower plurality of apertures that are arranged in a radial pattern and below the upper plurality of apertures. Each of the lower plurality of apertures may be fluidly coupled with at least one of the plurality of deposition outlets.

In some embodiments, the upper plurality of apertures may be arranged in an upper row and a lower row. Apertures in the lower row may be angled away from a central axis of the delivery tube. The apertures in the lower row may be angled away from the central axis by an angle of between about 1° and 10°. Angular positions of the apertures in the upper row may be offset from angular positions of the apertures in the lower row. The lower plurality of apertures may be arranged in an upper row and a lower row. The upper plurality of apertures may be arranged at regular intervals about a circumference of the delivery tube. The upper plurality of apertures may be offset from the lower plurality of apertures.

Some embodiments of the present technology may encompass semiconductor processing systems. The semiconductor processing systems may include a remote plasma source (RPS). The semiconductor processing systems may include a faceplate. The semiconductor processing systems may include a purge gas plenum. The semiconductor processing systems may include a delivery tube extending between and fluidly coupling the RPS and the faceplate. The delivery tube may be characterized by a central axis and a generally cylindrical sidewall. The generally cylindrical sidewall may define a plurality of apertures that are arranged in a radial pattern about the central axis. Each of the plurality of apertures may be fluidly coupled with the purge gas plenum. Each of the plurality of apertures may be angled away from the central axis.

In some embodiments, the plurality of apertures may be arranged at regular intervals about a circumference of the delivery tube. At least some of the plurality of apertures may be angled downward toward the faceplate. The purge gas plenum may be characterized by an annular body that extends around an outer periphery of the delivery tube. Each of the plurality of apertures may form a lumen that extends from the purge gas plenum to an interior surface of the delivery tube. The faceplate may be a first faceplate. The semiconductor processing systems may further include a second faceplate. The purge gas plenum may be a first purge gas plenum. The semiconductor systems may further include a second purge gas plenum. The delivery tube may be a first delivery tube. The semiconductor processing systems may further include a second delivery tube. The second delivery tube may extend between and fluidly couple the RPS and the second showerhead. The second delivery tube may be characterized by a second central axis and a generally cylindrical sidewall. The generally cylindrical sidewall may define a second plurality of apertures that are arranged in a radial pattern about the second central axis. Each of the second plurality of apertures may be fluidly coupled with the second purge gas plenum. Each of the second plurality of apertures may be angled away from the second central axis. The second plurality of apertures may be angled downward toward the second faceplate.

Some embodiments of the present technology may encompass methods of processing a substrate. The methods may include flowing a deposition gas from a deposition gas source into an interior of a delivery tube. A purge gas may be introduced into the interior of the delivery tube at a plurality of fluid ports that are radially arranged about the delivery tube to prevent backflow of the deposition gas into a remote plasma system (RPS) positioned at a top end of the delivery tube. The methods may include flowing the deposition gas into a faceplate coupled with a bottom end of the delivery tube.

In some embodiments, flowing the deposition gas from the deposition gas source into the interior of the delivery tube may include flowing the deposition gas from a manifold into the interior of the delivery tube via a plurality of apertures that are radially arranged about the delivery tube and that are disposed below the plurality of fluid ports. Flowing the deposition gas from the deposition gas source into the interior of the delivery tube may include flowing the deposition gas into the interior of the delivery tube from the RPS. At least some of the plurality of fluid ports may be angled away from a central axis of the delivery tube. At least some of the plurality of fluid ports may be angled downward toward the faceplate. Introducing the purge gas into the interior of the delivery tube may include flowing the purge gas from a purse gas plenum into the interior of the delivery tube via the fluid ports.

Some embodiments of the present technology may encompass semiconductor processing systems. The semiconductor processing systems may include a remote plasma source (RPS). The semiconductor processing systems may include a faceplate. The semiconductor processing systems may include an output manifold positioned between the RPS and the faceplate. The output manifold may be characterized by a plurality of deposition outlets that are fluidly coupled with a deposition gas source. The semiconductor processing systems may include a delivery tube extending between and fluidly coupling the RPS and the faceplate. The delivery tube may be characterized by a central axis and a generally cylindrical sidewall. The generally cylindrical sidewall may define a plurality of apertures that are arranged in a radial pattern about the central axis. Each of the plurality of apertures may be fluidly coupled with at least one of the plurality of deposition outlets. The delivery tube may include a purge inlet positioned above the plurality of apertures. The purge inlet may be fluidly coupled with a purge gas source. The purge inlet may be formed by a topmost opening of the delivery tube. Purge gas may be flowed into the delivery tube via the RPS. The purge inlet may include an upper plurality of radially arranged openings defined by the generally cylindrical sidewall.

Such technology may provide numerous benefits over conventional systems and techniques. For example, embodiments of the present technology may provide substrate processing equipment that may reduce the occurrence of backstreaming of deposition gases into the RPS unit, which helps prevent RPS strike faults and on-wafer problems. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 8 shows a schematic partial cross-sectional view of an exemplary semiconductor processing chamber according to some embodiments of the present technology.

Figure 1:
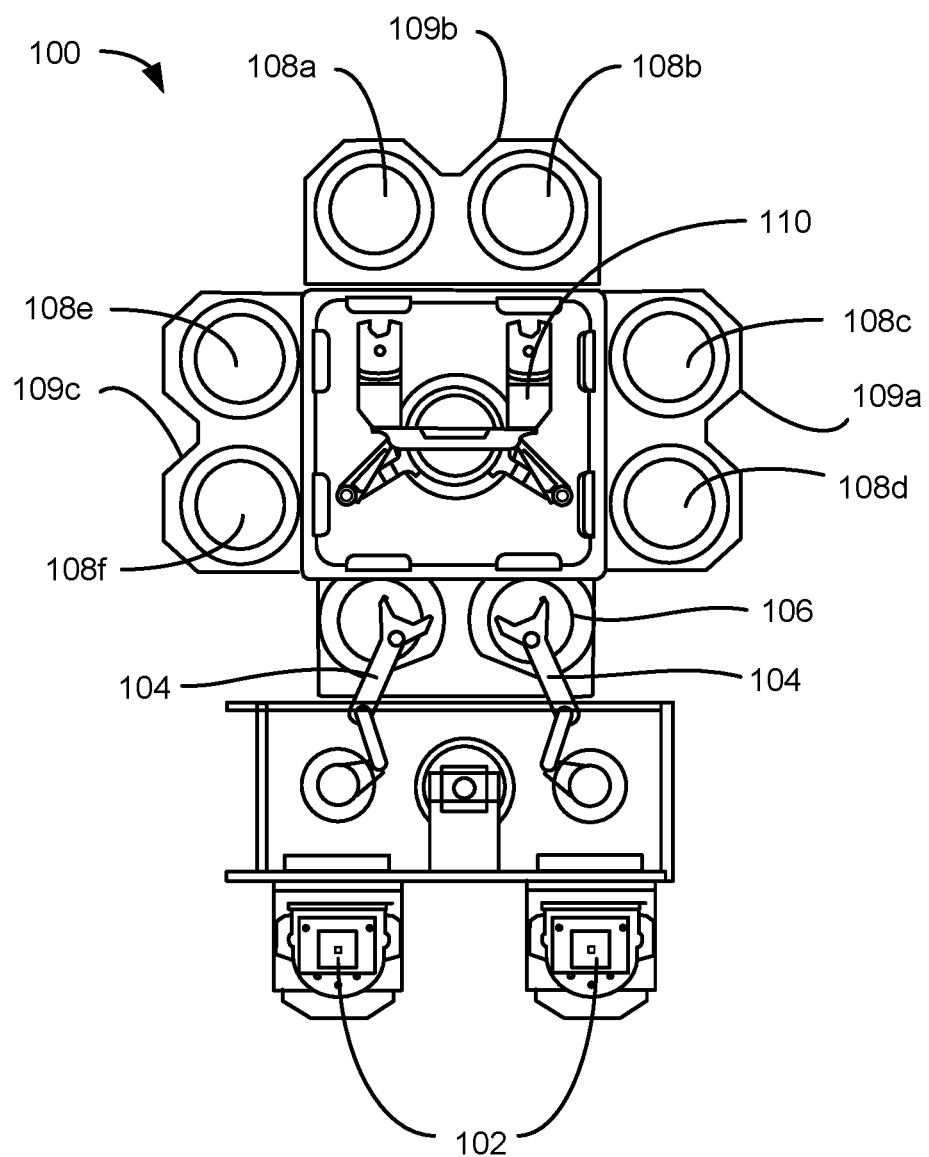
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

During plasma enhanced deposition processes, a remote plasma source (RPS) unit may be used to create and strike plasma. However, in some instances, the RPS unit may experience intermittent plasma strike faults, which may cause system downtime across multiple fabrication tools. Such faults may be caused when contaminants enter and poison the RPS unit, impacting the RPS unit's ability to successfully strike plasma. These contaminants may be caused by deposition gas that backstreams into the RPS unit. The deposition gas may change surface morphology of the internal surfaces of the RPS unit and cause failures when trying to strike plasma within the RPS unit.

These problems cannot be overcome simply by flowing purge gas through the RPS unit and delivery tube, as this flow is parallel with deposition gas flow from the gasbox and creates a turbulence within the processing chamber. This turbulent flow of purge gas disturbs the flow pattern of deposition gases and results in on-wafer problems, such as lowering the uniformity of the wafer and/or creating more stress on the wafer. Additionally, the use of mechanical valves fails to provide a desirable solution, as radicals cause heat within moving actuators of mechanical valves and cause the mechanical valves to malfunction.

The present technology overcomes these challenges by utilizing one or more chamber components that may facilitate positive pressure delivery of a purge gas at positions proximate the RPS unit to prevent deposition gases from backstreaming into the RPS unit. The present technology also provides one or more chamber components that mix the purge gas and deposition gas, rather than simply flowing a purge gas on its own downward from the RPS unit. By mixing the purge gas and deposition gas, any purge gas coming from the RPS unit (or introduced proximate the RPS unit) enters the processing chamber at the same time as the deposition gas and results in better uniformity of deposition gases into the processing region.

The present technology utilizes alternative components within the chamber to reduce or eliminate the occurrence of RPS backstreaming. By removing the RPS backstreaming from the chamber, changes to the inner surfaces of the RPS unit are prevented, RPS strike faults may be eliminated, and better uniformity of deposition gases on the wafer may be achieved. Although the disclosure will routinely identify specific etching processes utilizing the disclosed technology, it will be readily understood that the systems and methods are equally applicable to deposition and cleaning processes as may occur in the described chambers. As such, the technology should not be considered to be so limited as for use with etching processes alone.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
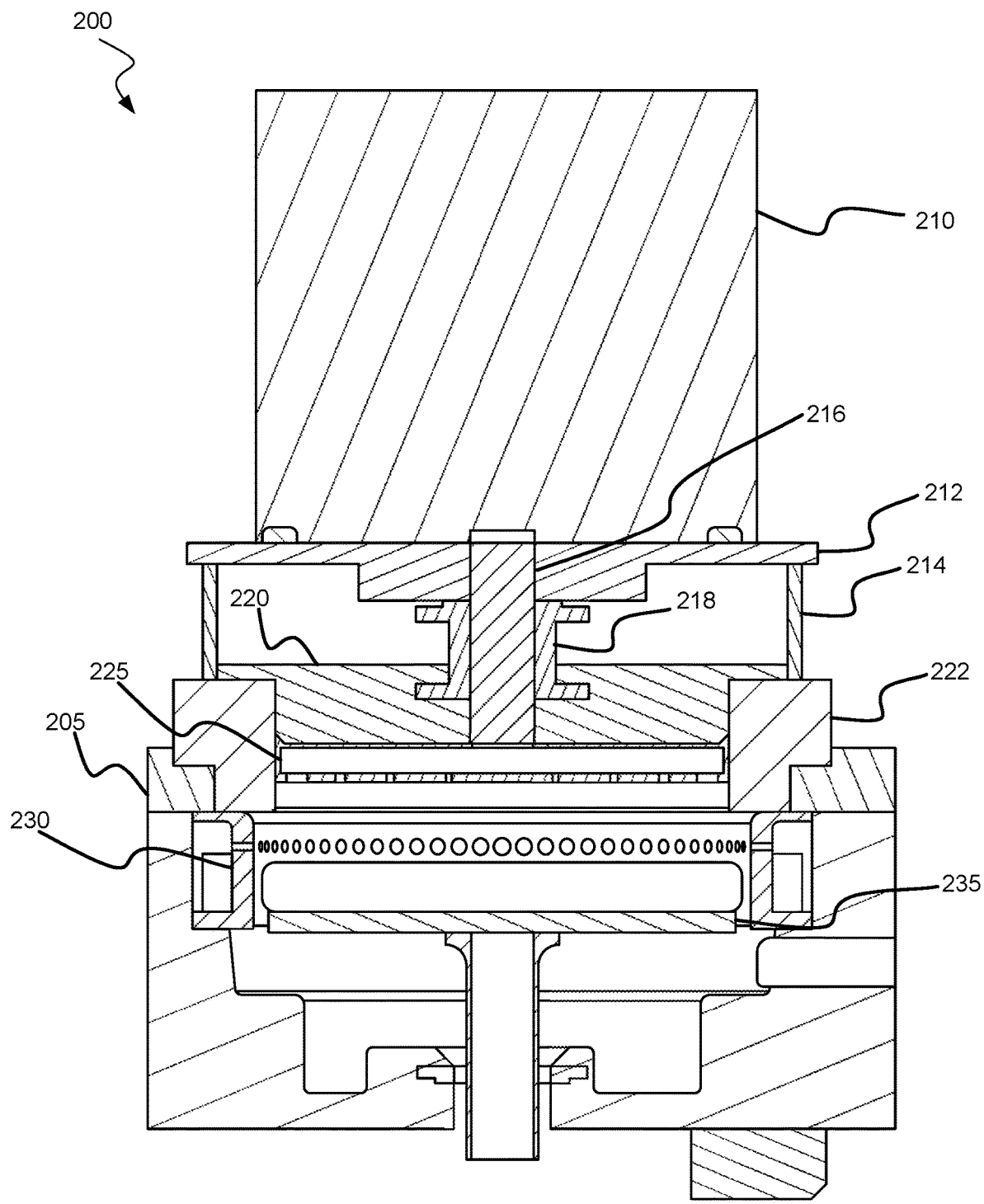
FIG. 2 shows a schematic cross-sectional view of an exemplary processing system according to some embodiments of the present technology.

FIG. 2 shows a schematic cross-sectional view of an exemplary processing system 200 according to embodiments of the present technology. The system may include a processing chamber 205, and a remote plasma source ("RPS") unit 210. The RPS unit 210 may be stabilized on a platform 212 having support members 214 that may couple with the processing chamber 205 at one or more positions about the processing chamber 205. By utilizing additional support members 214 along with platform 212, the weight of the RPS unit 210 may be properly distributed to protect components from sheer or other stresses related to the weight of the RPS unit 210. A delivery tube 216 may be coupled between or with the RPS unit 210 and the processing chamber 205 for delivering one or more precursors to the processing chamber 205. A flange adaptor 218 may be positioned about the delivery tube 216 in order to provide additional stability and support against the RPS unit 210, which may otherwise damage the delivery tube 216 from the support weight. The flange adaptor 218 may contact the platform 212 to provide support for the RPS unit 210, additionally so that the weight of the RPS unit 210 is not borne on the delivery tube 216.

The processing chamber 205 may include a gas box 220 providing access to the processing chamber 205. The gas box 220 may define an access to the processing chamber 205, and in embodiments, the access may be centrally defined or located within the gas box 220. The delivery tube 216 may be positioned or coupled within the access of the gas box 220 providing a precursor path between the RPS unit 210 and the interior of the processing chamber 205. The flange adaptor 218 may also contact the top plate 220 to distribute at least a portion of the weight of the RPS unit 210, to prevent or reduce stress on the delivery tube 216.

In embodiments a spacer 222 may at least partially define the processing chamber 205 exterior and interior walls. A gas distribution assembly 225 may be positioned within the processing chamber 205 proximate the delivery tube 216, and the gas distribution assembly 225 may allow distribution of precursors or plasma effluents into the processing chamber 205. A pumping liner 230 may be positioned within a processing region of the processing chamber 205. The pumping liner 230 may allow unreacted precursors or plasma effluents to be exhausted from the processing chamber 205. The pumping liner 230 may additionally allow particles etched in an etching process to be removed from the processing chamber 205 to prevent the particles from remaining on the substrate during subsequent processing operations.

A pedestal 235 may be included in the processing region of the processing chamber 205 and may be configured to support a substrate during etching or other process operations. The pedestal 235 may have one or more chucking mechanisms in various embodiments including electrostatic, vacuum, or gravitational, for example. The pedestal 235 may be rotatable or translatable in embodiments, and may be raised towards or lowered from the gas distribution assembly 225. In embodiments the pedestal 235 may include one or more lift pins for aiding transfer of a substrate into and out of the processing chamber 205. Pedestal 235 may additionally include heating or cooling mechanisms for maintaining substrate temperatures during processing operations.

The pedestal 235 may include an inlaid heating element including a filament, or may include one or more tubes or channels configured to pass a temperature controlled fluid that may raise or lower the temperature accordingly. Pedestal 235 may include a platform for supporting a substrate that is or includes a ceramic heater. The ceramic heater may heat the substrate to particular operating temperatures including from about 20° C. to over 1000° C. in embodiments. The ceramic heater may additionally heat the substrate above about 50° C., above about 100° C., above about 150° C., above about 200° C., above about 250° C., above about 300° C., above about 350° C., above about 400° C., above about 500° C., or higher in embodiments. The ceramic heater may additionally maintain the substrate temperature below about 1000° C., below about 900° C., below about 800° C., below about 700° C., below about 600° C., or below about 500° C. in embodiments. The ceramic heater may additionally be configured to heat or maintain the substrate temperature between about 100° C. and about 500° C. in embodiments, or between about 300° C. and about 500° C. in embodiments. In embodiments the heater is configured to maintain the substrate temperature below about 300° C., in which case alternative metal heating elements may be used instead of a ceramic heater. For example, a coated aluminum heater may be used, or an embedded or coated heater on an aluminum or treated aluminum pedestal.

The components of processing chamber 205 may be configured to withstand the operating environment during etching or other processing operations. The components of processing chamber 205 may be an anodized or oxidized material, including hard anodized aluminum, for example. Each component within processing chamber 205 that may be contacted by plasma effluents or other corrosive materials may be treated or coated to protect against corrosion.

Alternative materials may also be utilized to protect against corrosion from plasma effluents including fluorine or chlorine in embodiments. For example, one or more components within processing chamber 205 may be ceramic or quartz in embodiments. As a particular example, one or more components of gas distribution assembly 225, spacer 222, pumping liner 230, or any component that may be contacted by plasma or non-plasma precursors may be or include quartz or ceramic. Additionally, delivery tube 216 may be or include quartz, such as including a quartz liner within the delivery tube 216. The delivery tube may be aluminum or hard anodized aluminum in embodiments, and may be characterized by a quartz interior surface. RPS unit 210 may also be lined with quartz in order to protect the internal components from corrosion caused by precursors dissociated within the RPS unit 210 including or chlorine, for example. The RPS unit 210 may include anodized metals, and the RPS unit 210 chamber cavities may be lined with quartz to further protect against corrosion.

By utilizing a remote plasma from RPS unit 210, the processing chamber 205 may be further protected against internal corrosion caused by plasma generation. In embodiments, processing chamber 205 may not be configured to produce a plasma, and plasma generation may be performed externally to the processing chamber 205 in RPS unit 210. In embodiments additional plasma processing may be performed within processing chamber 205, such as by a capacitively-coupled plasma, although other plasma sources may be used. For example, gas box 220 and one or more components of the gas distribution assembly 225 may be utilized as electrodes by which a capacitively-coupled plasma may be produced. Additional or alternative plasma components within the chamber may be used to assist with recombination of plasma effluents by reducing the path length from plasma generation to interaction with a substrate.

Precursors dissociated by plasma will recombine after a certain residence time. For example, after a chlorine-based precursor is dissociated within RPS unit 210, the precursor or plasma effluents may be flowed through delivery tube 216 into processing chamber 205, and then interact with a substrate on pedestal 235. Depending on the length of the path of travel for the radical effluents, the effluents or radicals may recombine and at least partially lose the reactivity of the radical precursor. Additionally, the more complicated the path of travel, such as through various tubes or channels, the more protection may be included in the system as each component in contact with the plasma effluents may be treated or coated to protect from corrosion. Accordingly, processing chamber 205 may include a relatively straight line of travel from RPS unit 210 into processing chamber 205, and then through exhaust plenum 230. Additionally, once within processing chamber 205, precursors or plasma effluents may travel through one or more inline aspects of the gas distribution assembly 225 to contact a substrate. Components of the gas distribution assembly 225 may be utilized to improve uniformity of flow towards a substrate, but otherwise maintain a reduced length of precursor flow path to reduce recombination of the plasma effluents as well as residence time within the processing chamber 205.

Figure 3:
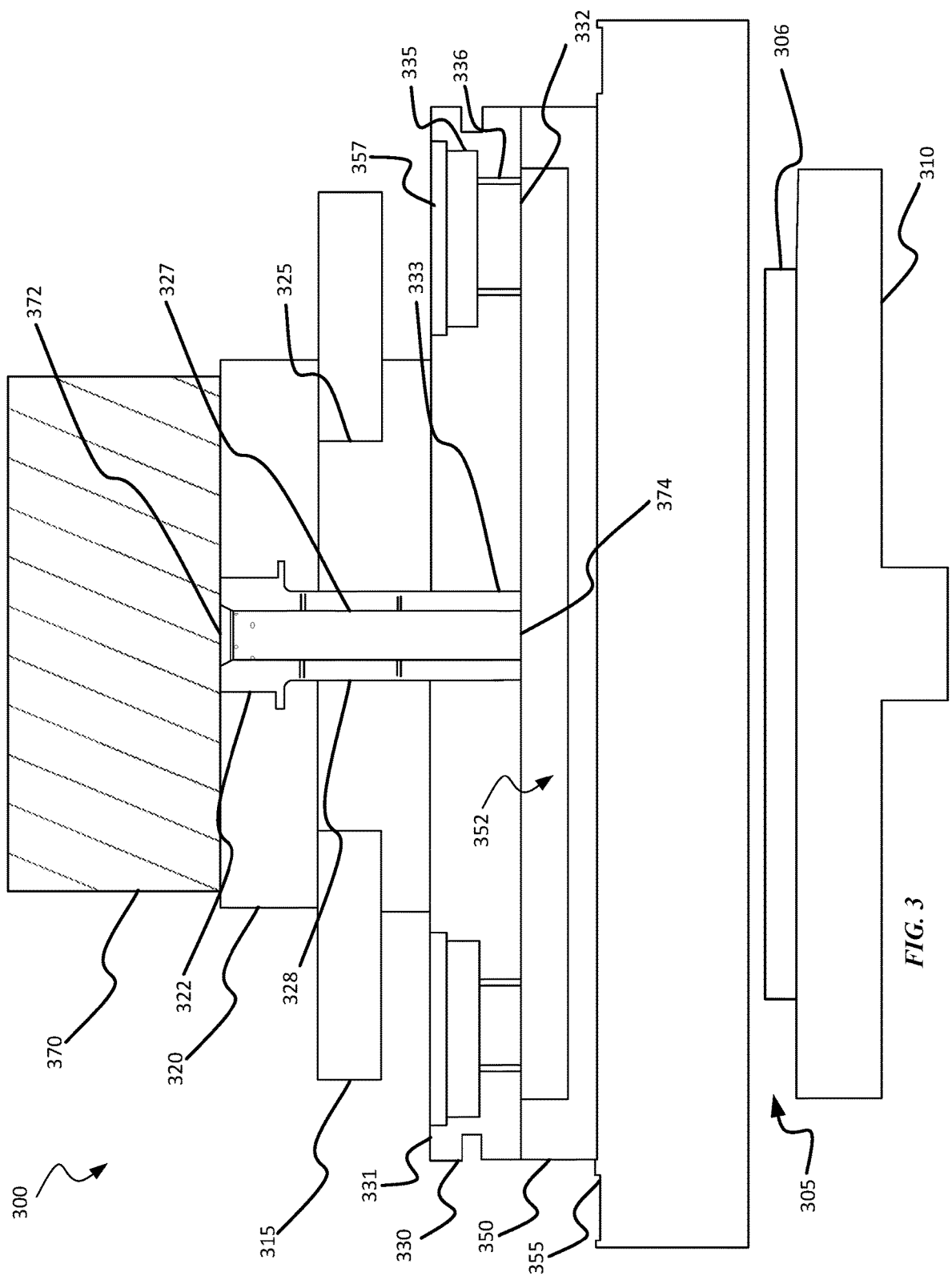
FIG. 3 shows a schematic partial cross-sectional view of an exemplary semiconductor processing chamber according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. Chamber 300 is understood to include any feature or aspect of system 200 discussed previously in some embodiments. The chamber 300 may be used to perform semiconductor processing operations including deposition of hardmask materials as previously described, as well as other deposition, removal, and cleaning operations. Chamber 300 may show a partial view of a processing region of a semiconductor processing system, and may not include all of the components, and which are understood to be incorporated in some embodiments of chamber 300.

As noted, FIG. 3 may illustrate a portion of a processing chamber 300. The chamber 300 may include a number of lid stack components, which may facilitate delivery or distribution of materials through the processing chamber 300 into a processing region 305, such as where a substrate 306 may be positioned on a pedestal 310, for example. A chamber lid plate 315 may extend across one or more plates of the lid stack and may provide structural support for components, such as a remote plasma source ("RPS") unit 370, which may provide precursors or plasma effluents for chamber cleaning or other processing operations. The RPS unit 370 may be stabilized on the chamber lid plate 315. Some embodiments may utilize additional support members (not shown) that may couple with the processing chamber 300 at one or more positions about the processing chamber 300 to properly distribute the weight of the RPS unit 370 to protect components from sheer or other stresses related to the weight of the RPS unit 370. A delivery tube 327 that defines a central aperture may extend between the RPS unit 370 and the processing chamber 300 for delivering one or more precursors to the processing chamber 300.

An output manifold 320 may be positioned on the lid plate 315 and may define a central aperture 322, which may extend about a central axis of the chamber 300 or output manifold 320. Processing chamber 300 may also include an insulator 325, which may electrically or thermally separate the output manifold 320 from other lid stack components. Insulator 325 may also define a central aperture 328, which may be axially aligned with the central aperture 322 of the output manifold 320. Processing chamber 300 may also include a gasbox 330, on which the insulator may be positioned.

Gasbox 330 may be characterized by a first surface 331 and a second surface 332 that may be opposite the first surface. Central aperture 333 may extend fully through the gasbox from the first surface 331 to the second surface 332. The central aperture 333 may be axially aligned with the central aperture 322 of the output manifold 320, and may be axially aligned with the central aperture 328 of the insulator 325. The apertures may define a channel within which the delivery tube 327 may be disposed. Gasbox 330 may also define one or more channels that may be fluidly accessed through the gasbox 330, and may allow multiple precursors to be delivered through the lid stack in a variety of flow profiles.

For example, gasbox 330 may define an annular channel 335 extending within the gasbox 330, and which may be recessed from first surface 331. As will be explained further below, annular channel 335 may be fluidly accessed through an inlet aperture, which may be positioned at any location about the gasbox 330, and may afford coupling for one or more precursors to be delivered from a gas panel or manifold. The inlet aperture may extend through first surface 331 as illustrated by the arrow, for providing precursors into the gasbox 330. In some embodiments, annular channel 335 may be concentric with the central aperture 333 of the gasbox 330. Gasbox 330 may also define one or more outlet apertures 336. Outlet apertures 336 may be defined through the annular channel 335, and may extend from annular channel 335 through second surface 332 of the gasbox 330. Hence, one or more precursors delivered into annular channel 335 through the gasbox 330 may bypass the RPS unit 370 and be delivered to one or more outer regions of the gasbox 330 through the gasbox 330.

Gasbox 330 may include additional features. For example, gasbox 330 may define a cooling channel 357, which may allow a cooling fluid to be flowed about the gasbox 330, and which may allow additional temperature control. As illustrated, the cooling channel 357 may be defined in the first surface 331 of the gasbox 330, and a lid may extend about the cooling channel to form a hermetic seal. Cooling channel 357 may extend about central aperture 333, and may also be concentric with the central aperture 333. As illustrated, annular channel 335 may be formed or defined within the gasbox 330 between the cooling channel and the second surface of the gasbox 330. In some embodiments the annular channel 335 may be vertically aligned with the cooling channel 357, and may be offset from the cooling channel 357 within a depth of the gasbox 330. To form the annular channel 335, in some embodiments the gasbox 330 may include one or more stacked plates. The plates may be bonded, welded, or otherwise coupled together to form a complete structure.

For example, gasbox 330 may include at least one plate, and may include two, three, four, or more plates depending on the features formed. As illustrated, gasbox 330 may include two or three plates, which may allow multiple paths to be formed to further distribute precursors towards the annular channel 335. For example, with a single point of delivery, uniformity may be achieved by modulating conductance within the channel relative to the outlet apertures. However, by utilizing one or more conductance paths defined within the gasbox 330, precursors may be delivered to multiple locations within the annular channel 335, which may increase uniformity of delivery through the gasbox 330, and may allow larger diameter outlet apertures without sacrificing delivery uniformity.

Semiconductor processing chamber 300 may also include additional components in some embodiments, such as a blocker plate 350, and a faceplate 355. Blocker plate 350 may define a number of apertures that may operate as a choke to increase radial diffusion to improve uniformity of delivery. Blocker plate 350 may be a first location through the lid stack where precursors delivered to the central aperture 333 of the gasbox 330 and precursors delivered to the annular channel 335 of the gasbox 330 may intermix. As illustrated, a volume 352 may be formed or defined between the gasbox 330 and the blocker plate 350. Volume 352 may be fluidly accessible from both central aperture 333 and the plurality of outlet apertures 336. Precursors delivered into the zone may then at least partially mix or overlap before continuing through the lid stack. By allowing an amount of mixing prior to contacting the substrate surface, an amount of overlap may be provided, which may produce a smoother transition at the substrate, and may limit an interface from forming on a film or substrate surface. Faceplate 355 may then deliver precursors to the processing region, which may be at least partially defined from above by the faceplate 355.

Figure 4:
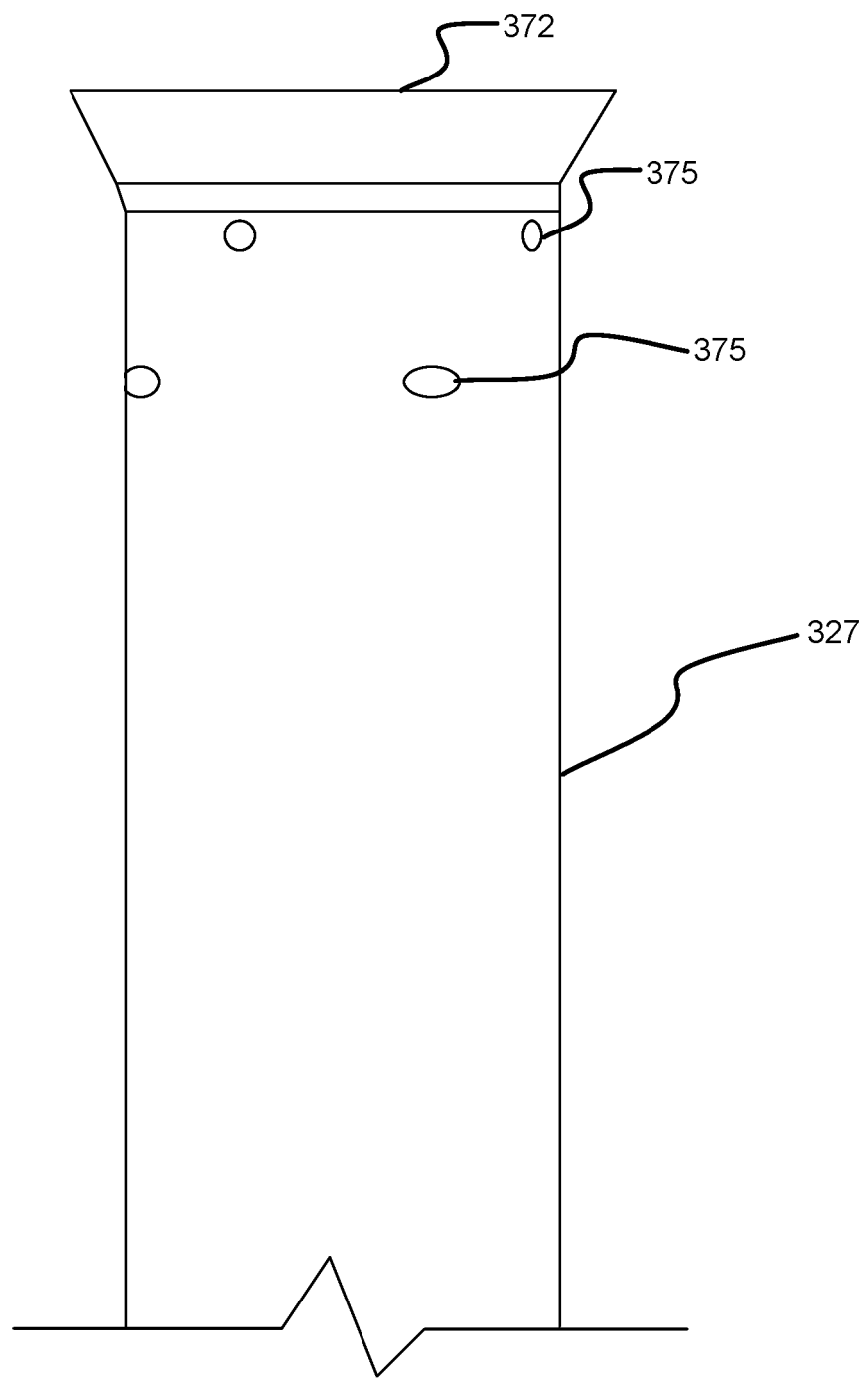
FIG. 4 shows a schematic partial cross-sectional view of a delivery tube according to some embodiments of the present technology.

The delivery tube 327 may extend through each of the central aperture 322, central aperture 328, and central aperture 333 such that a top 372 of the delivery tube 327 may be coupled with the RPS unit 370 and a bottom 374 of the delivery tube 327 extends through the second surface 332 of the gasbox 330. FIG. 4 illustrates a schematic partial cross-sectional view of delivery tube 327. In many embodiments, the delivery tube 327 may be characterized by a generally cylindrical sidewall, although it will be appreciated that other shapes of sidewalls are possible. The top 372 of the delivery tube 327 defines a fluid lumen that may receive precursors or plasma effluents from the RPS unit 370 and deliver the precursors or plasma effluents to the chamber 300 for chamber cleaning and/or other processing operations. The top 372 of the delivery tube 327 may taper from a large opening to a smaller diameter that defines a main body of the delivery tube 327. The RPS unit 370 may also be used create a positive pressure flow of purge gas down the delivery tube 327 to help eliminate RPS backstreaming during deposition operations. For example, purge gas, such as argon, helium, hydrogen, and the like, may be flowed downward from the RPS through the delivery tube 327. The purge gas may be flowed from the RPS unit 370 at various rates, which may be based on a flow rate of deposition gases through the delivery tube 327. For example, the purge gas may be flowed from the RPS unit 370 at rates of greater than or about 100 standard cubic centimeters per minute (sccm), greater than or about 200 sccm, greater than or about 300 sccm, greater than or about 400 sccm, greater than or about 500 sccm, greater than or about 600 sccm, greater than or about 700 sccm, greater than or about 800 sccm, greater than or about 900 sccm, greater than or about 1 liter per minute, greater than or about 2 liters per minute, or more, although higher or lower flow rates may be used based on the flow rates of deposition gas used in a particular processing application. The apertures 375 may be sized based on a flow rate and/or fluid velocity required by a particular deposition application. For example, the apertures 375 may have diameters of greater than or about 0.010 inch, greater than or about 0.020 inch, greater than or about 0.030 inch, greater than or about 0.040 inch, greater than or about 0.050 inch, or more to deliver deposition gases at a desired flow rate and/or velocity.

An upper region of the sidewall of the delivery tube 327 may define a number of radially arranged apertures 375. Each of these apertures 375 may be aligned with outlets of the output manifold 320, which may supply a deposition gas to the interior of the delivery tube 327. For example, deposition gas may be flowed through the apertures 375 at a flow rate of at least or about 1 liter per minute, at least or about 2 liters per minute, at least or about 3 liters per minute, or more, although higher or lower flow rates may be used to meet the needs of a particular processing application. The apertures 375 may be arranged at regular or irregular intervals about a periphery of the delivery tube 327. For example, four apertures 375 may be arranged with one aperture 375 positioned every 90 degrees about the periphery of the delivery tube 327. However, it will be appreciated that any number of apertures 375 may be provided in any arrangement. In some embodiments, the apertures 375 may be arranged in multiple rows along a length of the delivery tube 327. As just one example, the apertures 375 may be arranged in two rows that are spaced apart from one another by a vertical distance. For example, two rows of four apertures 375 may be defined by the delivery tube 327, with the rows spaced apart from one another by a vertical distance.

Some or all of the apertures 375 may extend through the sidewall of the delivery tube 327 at an angle that is aligned with radial lines of the delivery tube 327, while in some embodiments some or all of the apertures 375 may be angled away from a central axis of the delivery tube 327. For example, a top row of apertures 375 may be radially aligned, while a bottom row of apertures 375 may be angled away from a central axis of the delivery tube 327. In some embodiments, the apertures 375 may be angled away from the central axis by between about 1 degree and 10 degrees, between about 2 degrees and 9 degrees, between about 3 degrees and 8 degrees, between about 4 degrees and 7 degrees, between about 5 degrees and 6 degrees, etc. In some embodiments in which the apertures 375 are arranged in multiple rows, the apertures 375 in one or more of the rows may have angular positions relative to the central axis of the delivery tube 327 that are offset from angular positions of apertures 375 in at least one other row. For example, apertures 375 may be arranged in a top row of four apertures 375 and a bottom row of four apertures 375. The four apertures 375 in each row may be disposed at 90 degree intervals, with the top row and the bottom row being offset 45 degrees from one another such that the periphery of the delivery tube 327 includes an aperture every 45 degrees. In some embodiments, the apertures 375 of multiple rows of apertures 375 may be in vertical alignment with one another at similar angular positions.

As discussed above, clean, inert purge gas, such as argon, helium, or hydrogen, may be flowed from the RPS unit 370 down the delivery tube 327 at a position that is above the apertures 375. This flow of purge gas from the RPS unit 370 creates a downward positive pressure fluid flow that prevents RPS backstreaming and eliminates the possibility that backstreaming may cause any particulate in RPS unit 370 to be blown into processing chamber 300 and onto the substrate being processed.

Figure 5:
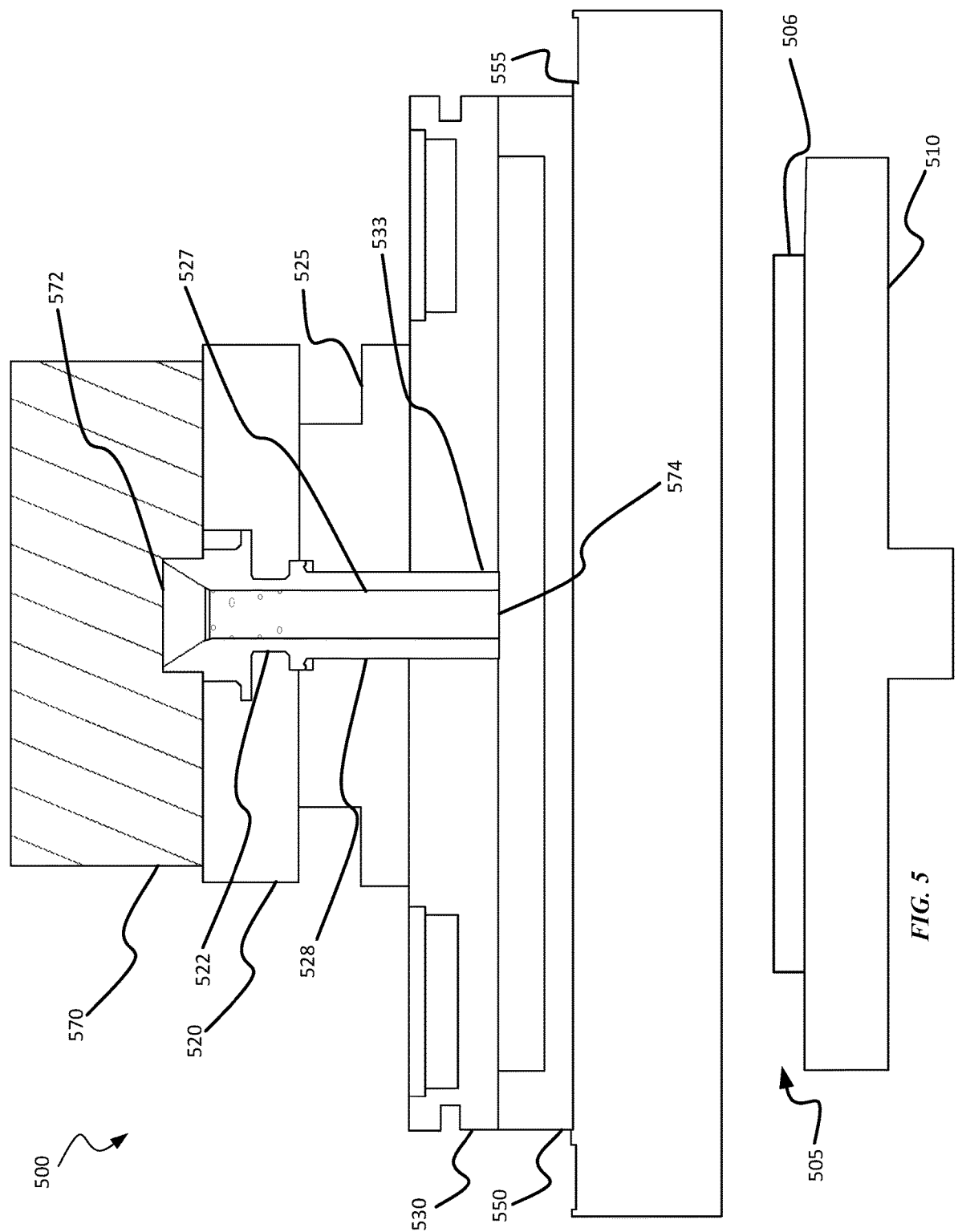
FIG. 5 shows a schematic cross-sectional view of an exemplary semiconductor processing chamber according to some embodiments of the present technology.

FIG. 5 shows a schematic partial cross-sectional view of an exemplary semiconductor processing chamber 500 according to some embodiments of the present technology. FIG. 5 may include one or more components discussed above with regard to FIGS. 2 and 3, and may illustrate further details relating to that chamber. Chamber 500 is understood to include any feature or aspect of system 200 and/or chamber 300 discussed previously. Chamber 500 may show a partial view of a processing region of a semiconductor processing system, and may not include all of the components, and which are understood to be incorporated in some embodiments of chamber 500. Chamber 500 may include a processing region 505, such as where a substrate 506 may be positioned on a pedestal 510, a RPS unit 570, an output manifold 520 that defines a central aperture 522, an insulator 525 that defines a central aperture 528, and a gasbox 530 defining a central aperture 533. Semiconductor processing chamber 500 may also include additional components in some embodiments, such as a blocker plate 550, and a faceplate 555.

Figure 6:
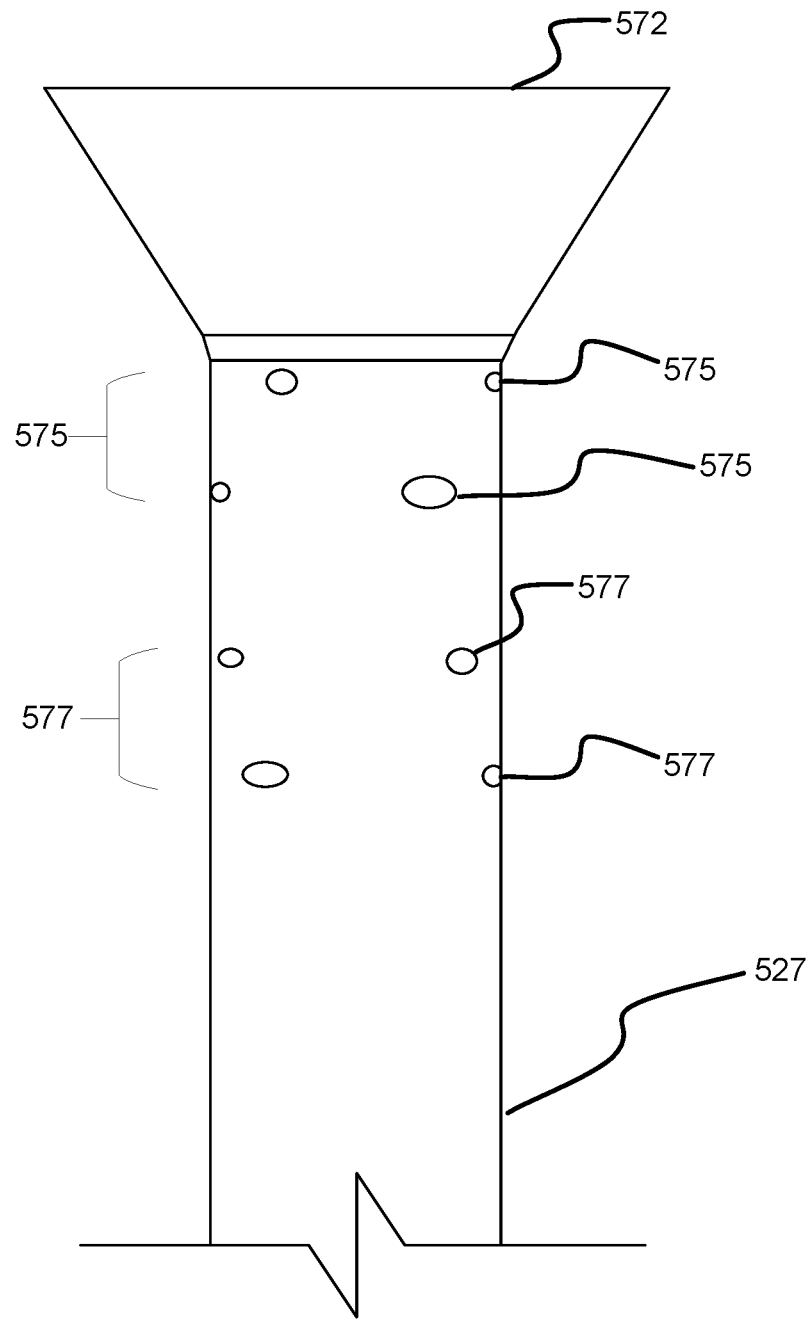
FIG. 6 shows a schematic partial cross-sectional view of a delivery tube according to some embodiments of the present technology.

A delivery tube 527 may extend through each of the central aperture 522, central aperture 528, and central aperture 533 such that a top 572 of the delivery tube 527 may be coupled with the RPS unit 570 and a bottom 574 of the delivery tube 527 extends through the gasbox 530. The delivery tube 527 provides a fluid path from the RPS unit 570 to the processing chamber 500, enabling the RPS unit 570 to deliver precursors and/or plasma effluents to the chamber 300 for chamber cleaning and/or other processing operations. FIG. 6 is a schematic partial cross-sectional view of the delivery tube 527. In many embodiments, the delivery tube 527 may be characterized by a generally cylindrical sidewall, although it will be appreciated that other shapes of sidewalls are possible. The top 572 of the delivery tube 527 may define a fluid lumen that may receive precursors or plasma effluents from the RPS unit 570 and deliver the precursors or plasma effluents to the chamber 500 for chamber cleaning or other processing operations. The top 572 of the delivery tube 527 may taper from a large opening to a smaller diameter that defines a main body of the delivery tube 527. An upper region of the sidewall of the delivery tube 527 may define a number of sets of radially arranged apertures. For example, a set of upper apertures 575 and a set of lower apertures 577 may be defined by the sidewall of the delivery tube 527.

Lower apertures 577 aligned with outlets of the output manifold 520, and may supply a deposition gas from the output manifold 520 to the interior of the delivery tube 527. For example, deposition gas may be flowed through the lower apertures 577 at a flow rate of at least 1 liter per minute, at least 2 liters per minute, at least 3 liters per minute, or more, although higher or lower flow rates may be used to meet the needs of a particular processing application. Lower apertures 577 may be arranged at regular or irregular intervals about a periphery of the delivery tube 527. For example, greater than or about two, greater than or about three, greater than or about four, or more lower apertures 577 may be arranged with one lower aperture 577 positioned every 90 degrees about the periphery of the delivery tube 527. However, it will be appreciated that any number of lower apertures 577 may be provided in any arrangement. In some embodiments, lower apertures 577 may be arranged in multiple rows along a length of the delivery tube 527. As just one example, lower apertures 575 may be arranged in two rows that are spaced apart from one another by a vertical distance.

Upper apertures 575 may be positioned above the lower apertures 577 and may be aligned with outlets of the output manifold 520. Upper apertures 575 may provide fluid paths for supplying a purge gas, such as argon, helium, hydrogen, and the like, to the interior of the delivery tube 527. For example, the purge gas may be flowed through the upper aperture 577 at rates of greater than or about 100 sccm, greater than or about 200 sccm, greater than or about 300 sccm, greater than or about 400 sccm, greater than or about 500 sccm, greater than or about 600 sccm, greater than or about 700 sccm, greater than or about 800 sccm, greater than or about 900 sccm, greater than or about 1 liter per minute, greater than or about 2 liters per minute, or more, although higher or lower flow rates may be used based on the flow rates of deposition gas used in a particular processing application. By flowing clean, inert purge gas through the upper apertures 575 at a position that is above the lower apertures 577, the flow of purge gas creates a positive pressure fluid barrier that prevents RPS backstreaming.

The upper apertures 575 may be arranged at regular or irregular intervals about a periphery of the delivery tube 527. For example, four upper apertures 575 may be arranged with one upper aperture 575 positioned every 90 degrees about the periphery of the delivery tube 527. However, it will be appreciated that any number of upper apertures 575 may be provided in any arrangement. In some embodiments, upper apertures 575 may be arranged in multiple rows along a length of the delivery tube 527. As just one example, upper apertures 575 may be arranged in two rows that are spaced apart from one another by a vertical distance.

The upper apertures 575 and lower apertures 577 may be sized based on a flow rate and/or fluid velocity required by a particular deposition application. For example, the upper apertures 575 and lower apertures 577 may have diameters of greater than or about 0.010 inch, greater than or about 0.020 inch, greater than or about 0.030 inch, greater than or about 0.040 inch, greater than or about 0.050 inch, or more to deliver deposition gases at a desired flow rate and/or velocity. In some embodiments, all of the upper apertures 575 and lower apertures 577 may be the same size, while in other embodiments some or all of the upper apertures 575 and/or lower apertures 577 may have different sizes. For example, the upper apertures 575 may have a first diameter while the lower apertures 577 may have a second diameter that is smaller or larger than the first diameter. In some embodiments in which the upper apertures 575 and/or lower apertures 577 are arranged in multiple rows, the apertures in each row may have different sizes. As just one example, a top row of upper apertures 575 may have a different diameters than upper apertures 575 in a bottom row.

In some embodiments, some or all of the upper apertures 575 and/or lower apertures 577 may extend through the sidewall of the delivery tube 527 at an angle that is aligned with radial lines of the delivery tube 527, while in some embodiments some or all of the upper apertures 575 and/or lower apertures 577 may be angled away from a central axis of the delivery tube 527. For example, a top row of the upper apertures 575 and/or lower apertures 577 may be radially aligned, while a bottom row of upper apertures 575 and/or lower apertures 577 may be angled away from a central axis of the delivery tube 527. By angling some or all of the upper apertures 575 and/or lower apertures 577 away from the central axis, a rotational fluid flow may be created within the delivery tube 527 that may help mix the purge gases and deposition gases. In some embodiments, the upper apertures 575 and/or lower apertures 577 may be angled away from the central axis by between about 1 degree and 10 degrees, between about 2 degrees and 9 degrees, between about 3 degrees and 8 degrees, between about 4 degrees and 7 degrees, between about 5 degrees and 6 degrees, etc. Some or all of the upper apertures 575 may be in vertical alignment with some or all of the lower apertures 577, while in some embodiments some or all of the upper apertures 575 may be angularly offset from some or all of the lower apertures 577. In some embodiments in which the upper apertures 575 and/or lower apertures 577 are arranged in multiple rows, the upper apertures 575 and/or lower apertures 577 in one or more rows may have angular positions relative to the central axis of the delivery tube 527 that are offset from angular positions of apertures in at least one other row. For example, as illustrated the apertures of each row of both the upper apertures 575 and lower apertures 577 may be angularly offset from one another such that no apertures share an angular position. However, the upper apertures 575 and/or lower apertures 577 of some rows of upper apertures 575 and/or lower apertures 577 may have similar angular positions (i.e., may be in vertical alignment) as upper apertures 575 and/or lower apertures 577 in other rows.

Figure 7A:
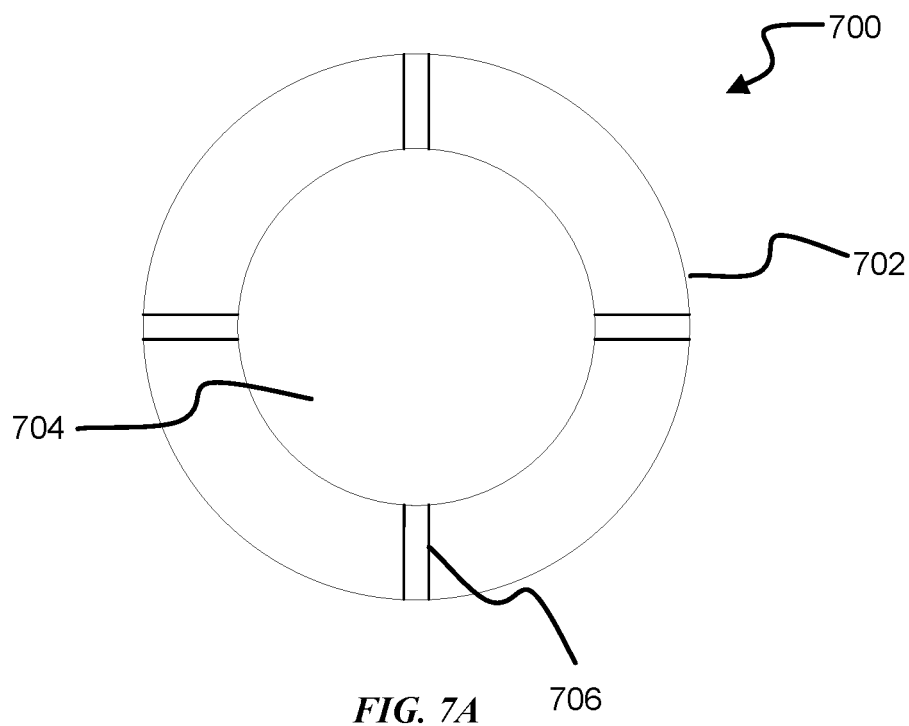
FIG. 7A shows a schematic cross-sectional view of an exemplary delivery tube according to some embodiments of the present technology.
Figure 7B:
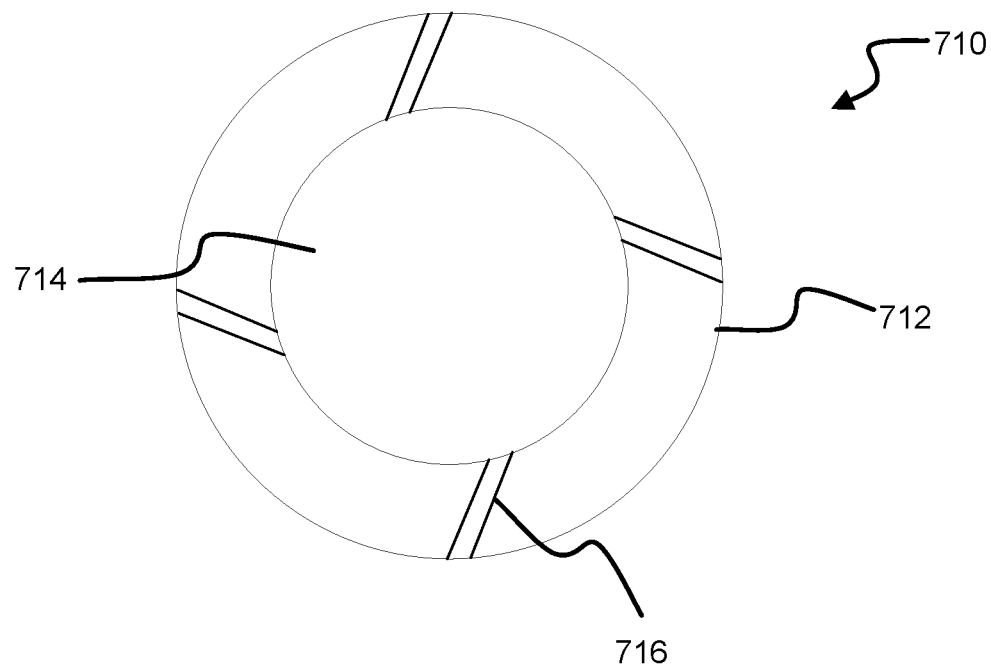
FIG. 7B shows a schematic cross-sectional view of an exemplary delivery tube according to some embodiments of the present technology.

FIGS. 7A-7B show schematic cross sections of exemplary delivery tubes according to some embodiments of the present technology. FIG. 7A illustrates a delivery tube 700 that may include similar features as delivery tubes 327 and 527 described herein. The delivery tube 700 may be characterized by at least one sidewall 702 that defines a fluid lumen 704 that extends from a RPS unit to a processing chamber of a semiconductor processing system. Oftentimes, the sidewall 702 may have a generally circular cross-section such that the delivery tube 700 is generally cylindrical, however other cross-sectional shapes are possible. The sidewall 702 may define a number of apertures 706 that extend through a thickness of the sidewall 702 to form fluid paths to the fluid lumen 704. The apertures 706 may extend through the sidewall 702 along radial lines of the delivery tube 700. For example, four apertures 706 may be provided at 90 degree intervals from one another, however other numbers and angular intervals, including irregular intervals, may be utilized in some embodiments. FIG. 7B shows another delivery tube 710. Delivery tube 710 may be similar to delivery tube 700 and may include similar features as delivery tubes 327 and 527 described herein. Delivery tube 710 may be characterized by at least one sidewall 712 that defines a fluid lumen 714 that extends from a RPS unit to a processing chamber of a semiconductor processing system. The sidewall 712 may define a number of apertures 716 that may extend through the sidewall 712 an angle away from a central axis of the delivery tube 710. In some embodiments, the apertures 716 may be angled away from the central axis by between about 1 degree and 10 degrees, between about 2 degrees and 9 degrees, between about 3 degrees and 8 degrees, between about 4 degrees and 7 degrees, between about 5 degrees and 6 degrees, etc. Oftentimes, an arrangement of apertures 716 such as shown here may be used in lower rows of apertures, such as the lower rows of apertures described in conjunction with FIGS. 3-6. While FIGS. 7A and 7B show delivery tubes with four apertures, it will be appreciated that any number of apertures may be used in some embodiments. The apertures may be arranged at regular intervals, such as every 90 degrees, or may be arranged at irregular intervals. Additionally, it will be appreciated that the apertures in FIGS. 7A and 7B may represent those apertures in a single row and that multiple rows of apertures may be provided in a single delivery tube as described herein. In some embodiments, an arrangement of apertures such as apertures 706 may be used in one row, such as a top row, of a delivery tube, while an arrangement of apertures similar to apertures 716 may be used in another row, such as a bottom row of apertures.

FIG. 8 shows a schematic partial cross-sectional view of an exemplary semiconductor processing chamber 800 according to some embodiments of the present technology. FIG. 8 may include one or more components discussed above with regard to FIGS. 2 and 3, and may illustrate further details relating to that chamber. Chamber 800 is understood to include any feature or aspect of system 200 and/or chamber 300 discussed previously in some embodiments. Chamber 800 may show a partial view of a processing region of a semiconductor processing system, and may not include all of the components, and which are understood to be incorporated in some embodiments of chamber 800. Chamber 800 may include a processing region 805, such as where a substrate 806 may be positioned on a pedestal 810. The chamber 800 may include a RPS unit 870 and a gasbox 830 that may define a central aperture 833. Semiconductor processing chamber 800 may also include additional components in some embodiments, such as a blocker plate 850, and a faceplate 855.

The delivery tube 827 may extend through central aperture 833 such that a top 872 of the delivery tube 827 may be coupled with the RPS unit 870 and a bottom 874 of the delivery tube 827 may extend through the gasbox 830. An inert gas plenum 880 may be disposed about at least a portion of the delivery tube 827 and may be fluidly coupled with an interior of the delivery tube 827 via a number of apertures 875 defined in a sidewall of the delivery tube 827. For example, a number of lumens 882 may extend between the purge gas plenum 880 and the delivery tube 827 to provide fluid paths from the purge gas plenum 880 to the apertures 875. This enables the inert gas plenum 880 to deliver an inert gas, such as argon, helium, hydrogen, and the like, to the interior of the delivery tube 827 at a number of radial locations to generate a gas vortex within the interior of the delivery tube 827. This vortex may draw fluid within the delivery tube 827 downward toward the gasbox 830 and may prevent backstreaming of any plasma, precursors, or deposition gas into the RPS unit 870. The purge gas may be flowed through the apertures 875 at a rate of greater than or about 100 sccm, greater than or about 200 sccm, greater than or about 300 sccm, greater than or about 400 sccm, greater than or about 500 sccm, greater than or about 600 sccm, greater than or about 700 sccm, greater than or about 800 sccm, greater than or about 900 sccm, greater than or about 1 liter per minute, or more, with higher flow rates being used to combat higher levels of backstreaming gases. In many embodiments, the apertures 875 may be positioned in an upper region of the delivery tube 827 proximate the RPS unit 870 to generate a vortex that acts as a fluid barrier proximate the RPS unit 870. The delivery tube 827 may be sized and shaped to maintain a post-ignition pressure of at least 5 Torr, commonly at least 10 Torr, and oftentimes at least 20 Torr, or higher. For example, in a particular embodiment, the delivery tube 827 may have a generally cylindrical sidewall that has a diameter at least or about 1.0 inch, at least or about 1.1 inches, at least or about 1.2 inches, at least or about 1.3 inches, at least or about 1.4 inches, at least or about 1.5 inches, or more, although it will be appreciated that other sizes and/or shapes of delivery tubes 827 are possible in various embodiments. The apertures 875 may have diameters of greater than or about 0.050 inch, greater than or about 0.100 inch, greater than or about 0.150 inch, greater than or about 0.200 inch, greater than or about 0.250 inch, greater than or about 0.300 inch, greater than or about 0.350 inch, greater than or about 0.400 inch, greater than or about 0.450 inch, greater than or about 0.500 inch, or more, which smaller apertures 875 generating a higher pressure drop within the delivery tube 827.

In some embodiments, some or all of the apertures 875 may be angled downward toward the gasbox 830. Apertures 875 with downward angles may increase the positive pressure within the interior of the delivery tube 827 in a direction away from the RPS unit 870 when gas is introduced via the apertures 875. The apertures 875 may be angled downward by between about 1 degree and 10 degrees, between about 2 degrees and 9 degrees, between about 3 degrees and 8 degrees, between about 4 degrees and 7 degrees, between about 5 degrees and 6 degrees, etc. relative to horizontal, with greater degrees of downward slope may creating stronger vortexes.

Figure 9:
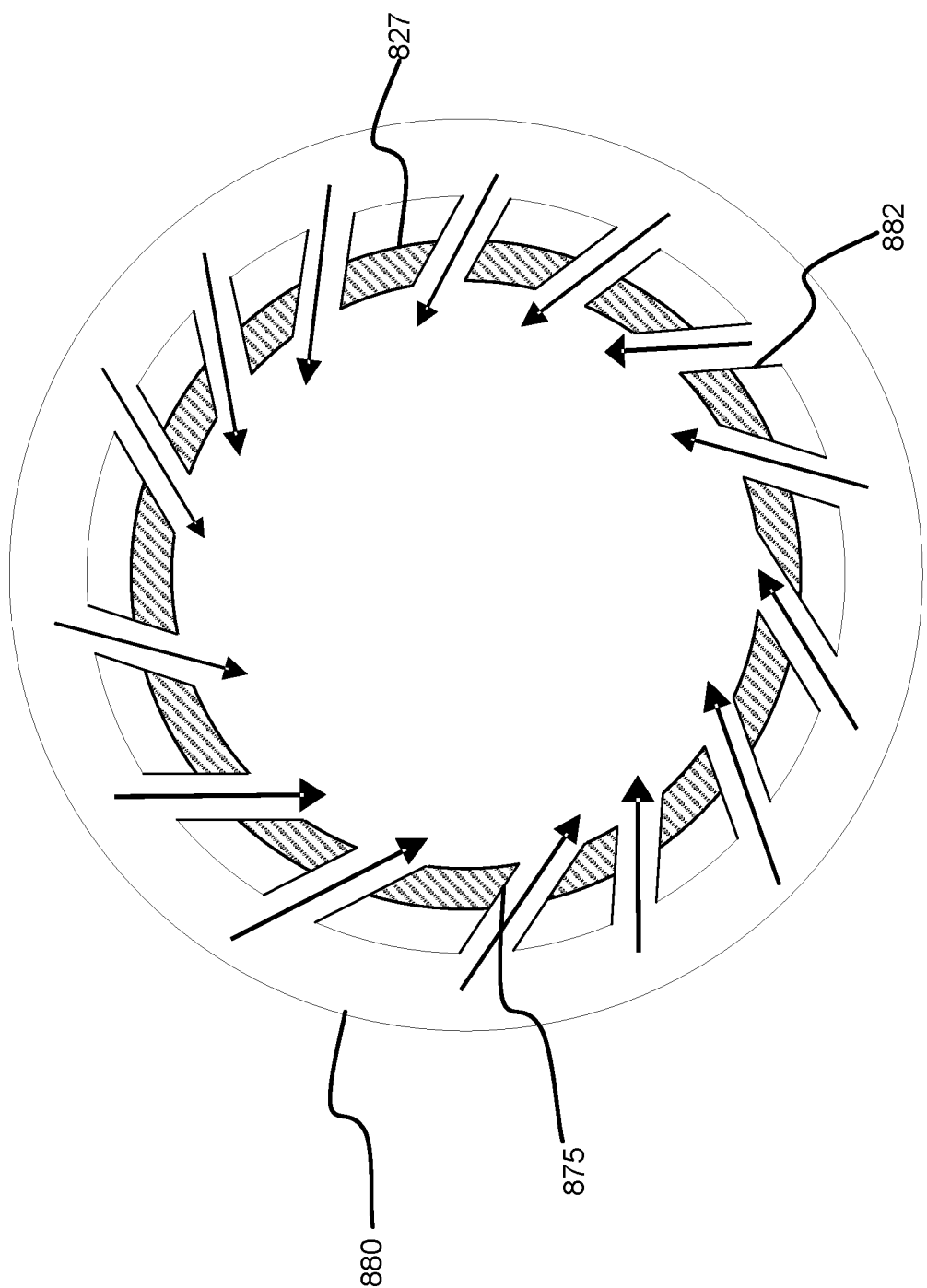
FIG. 9 shows a schematic cross section of a delivery tube according to some embodiments of the present technology.

The apertures 875 may be arranged at regular or irregular intervals about a periphery of the delivery tube 827. In some embodiments, some or all of the apertures 875 may extend through the sidewall of the delivery tube 827 at an angle that is aligned with a radial line of the delivery tube 827, while in some embodiments some or all of the apertures 875 may be angled away from a central axis of the delivery tube 827 along a horizontal axis of the delivery tube 827. FIG. 9 shows a schematic cross-section of delivery tube 827 and inert gas plenum 880. The apertures 875 may be coupled with the purge gas plenum 880 via lumens 882. As noted above, lumens 882 may extend between the purge gas plenum 880 and the delivery tube 827 to provide fluid paths from the purge gas plenum 880 to the apertures 875. The apertures 875 may be angled away from the central axis by between about 1 degree and 10 degrees, between about 2 degrees and 9 degrees, between about 3 degrees and 8 degrees, between about 4 degrees and 7 degrees, between about 5 degrees and 6 degrees, etc. While shown with 14 apertures 875, it will be appreciated that any number of apertures 875 may be provided.

Figure 10:
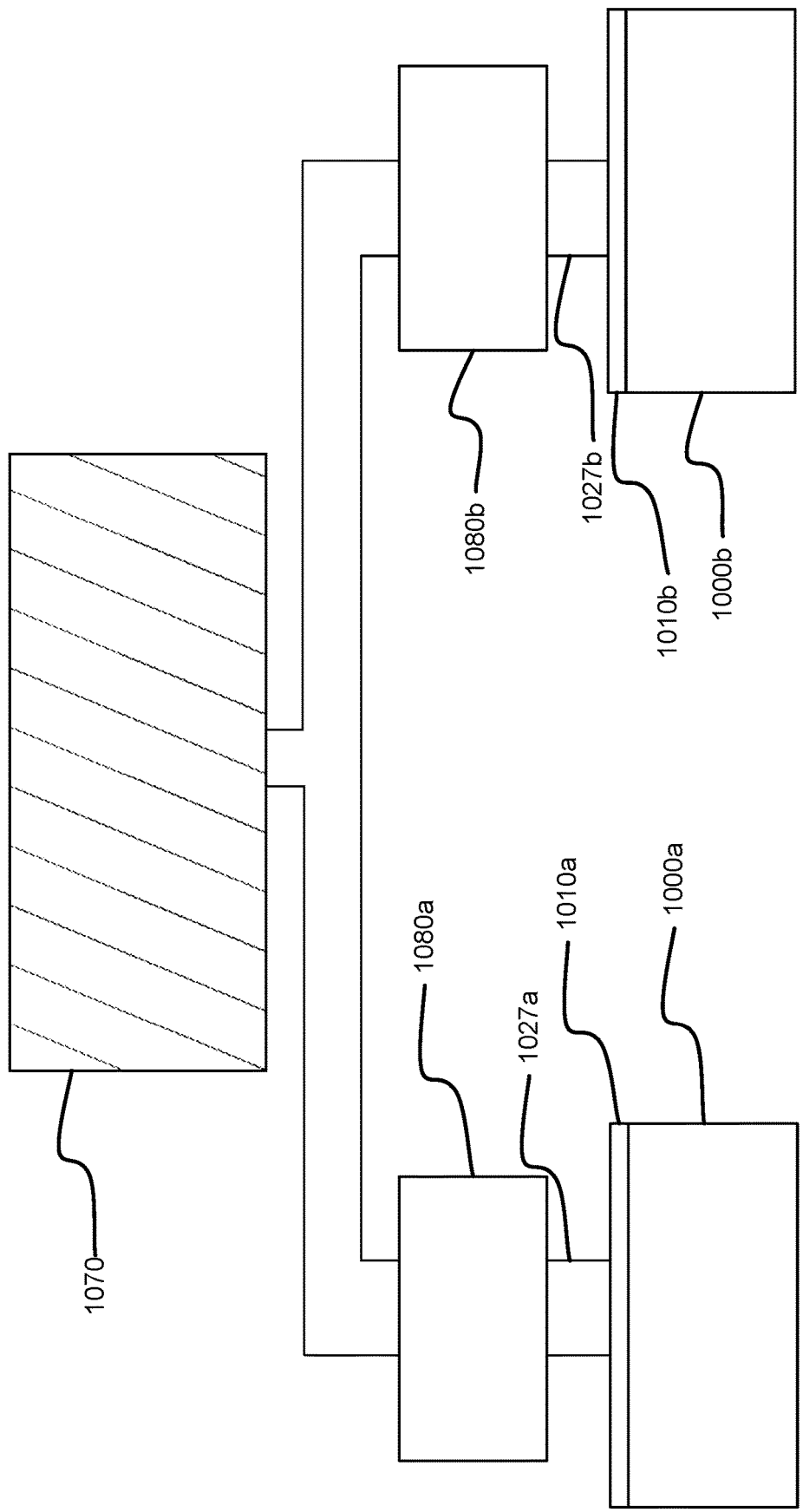
FIG. 10 shows a schematic cross-sectional view of a dual chamber semiconductor processing system according to embodiments of the present technology.

In some embodiments, a single RPS unit may be used to deliver precursors or plasma effluents to multiple semiconductor processing chambers. FIG. 10 shows a simplified schematic illustrating such an arrangement, with an RPS unit 1070 being coupled with two delivery tubes 1027a, 1027b. Each delivery tube 1027a 1027b may be similar to delivery tube 827 and may deliver precursors or plasma effluents to a respective processing chamber 1000a, 1000b. Each processing chamber 1000a, 1000b may be similar to processing chamber 300 and/or 800 described herein and may each include a faceplate 1010a, 1010b. Inert gas plenums 1080a, 1080b may be similar to inert gas plenum 880 and may be positioned about each respective delivery tube 1027a, 1027b. Each inert gas plenum 1080a, 1080b may supply a respective delivery tube 1027a, 1028b with a flow of inert gas, as described above in relation to FIGS. 8 and 9. By providing each delivery tube/processing chamber pair with a dedicated inert gas plenum, the RPS unit 1070 is not only isolated from backstreaming but also may be isolated from the gases of each processing chamber 1000, which enables the RPS unit 1070 to avoid cross talk between the different processing chambers 1000.

Figure 11:
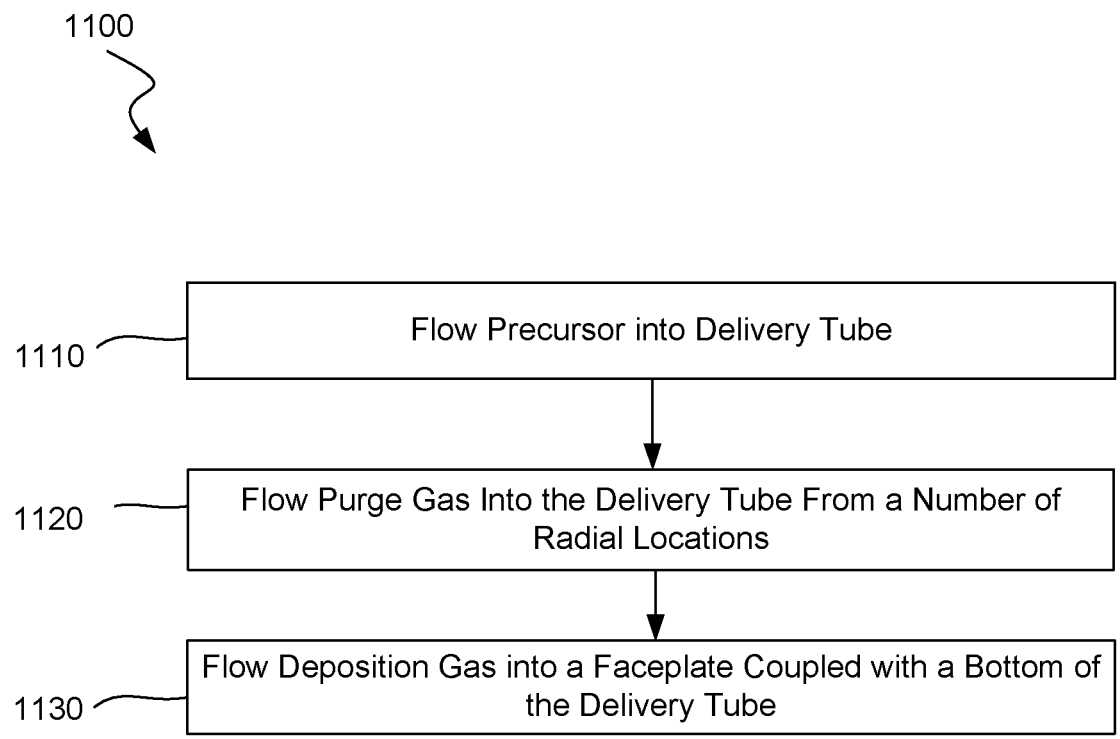
FIG. 11 is a flowchart of an exemplary method of etching a substrate according to some embodiments of the present technology.

FIG. 11 illustrates a method 1100 of etching a substrate according to embodiments of the present technology. Method 1100 may include flowing a deposition gas from a deposition gas source into an interior of a delivery tube at operation 1110. At operation 1120, a purge gas may be flowed into the interior of the delivery tube at a plurality of fluid ports that are radially arranged about the delivery tube to prevent backflow of the deposition gas into a remote plasma system (RPS) positioned at a top end of the delivery tube. The deposition gas may be flowed into a faceplate coupled with a bottom end of the delivery tube at operation 1030.

The flowing of deposition gas from the deposition gas source into the interior of the delivery tube may include flowing the deposition gas from a manifold into the interior of the delivery tube via a plurality of apertures that are radially arranged about the delivery tube and that are disposed below the plurality of fluid ports. In some embodiments, flowing the deposition gas from the deposition gas source into the interior of the delivery tube may include flowing the deposition gas into the interior of the delivery tube from the RPS. At least some of the plurality of fluid ports may be angled away from a central axis of the delivery tube. At least some of the plurality of fluid ports may be angled downward toward the faceplate. The introduction of the purge gas into the interior of the delivery tube may include flowing the purge gas from a purse gas plenum into the interior of the delivery tube via the fluid ports.

By flowing purge gas into the delivery tubes at positions above at least a portion of the deposition gas flow, the methods may prevent any gases from the chamber from backstreaming into the RPS. This helps prevent changes to the inner surfaces of the RPS unit in order to eliminate RPS strike faults and to delivery better uniformity of deposition gases on the wafer.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an aperture" includes a plurality of such apertures, and reference to "the plate" includes reference to one or more plates and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing system, comprising:
a remote plasma source (RPS);
a faceplate;
an output manifold positioned between the RPS and the faceplate, wherein the output manifold is characterized by a plurality of purge outlets that are fluidly coupled with a purge gas source;
a delivery tube extending between and fluidly coupling the RPS and the faceplate, wherein:
an upstream end of the delivery tube is characterized by a first diameter that tapers to a smaller second diameter that defines a cylindrical sidewall that defines an upper plurality of apertures that are arranged in a radial pattern, the cylindrical sidewall extending to a downstream end of the delivery tube;
each of the upper plurality of apertures is fluidly coupled with at least one of the plurality of purge outlets; and
the cylindrical sidewall defines a lower plurality of apertures that are arranged in a radial pattern and below the upper plurality of apertures.

2. The semiconductor processing system of claim 1, wherein:
the upper plurality of apertures are arranged in an upper row and a lower row; and
apertures in the lower row are angled away from a central axis of the delivery tube.

3. The semiconductor processing system of claim 2, wherein:
the apertures in the lower row are angled away from the central axis by an angle of between about 1° and 10°.

4. The semiconductor processing system of claim 2, wherein:
angular positions of the apertures in the upper row are offset from angular positions of the apertures in the lower row.

5. The semiconductor processing system of claim 1, wherein:
the lower plurality of apertures are arranged in an upper row and a lower row.

6. The semiconductor processing system of claim 1, wherein:
the upper plurality of apertures are arranged at regular intervals about a circumference of the delivery tube.

7. The semiconductor processing system of claim 1, wherein:
the upper plurality of apertures are offset from the lower plurality of apertures.

8. A semiconductor processing system, comprising:
a remote plasma source (RPS);
a faceplate;
a purge gas plenum;
a delivery tube coupled with the RPS and extending between and fluidly coupling the RPS and the faceplate, wherein:
the delivery tube is characterized by a central axis and a cylindrical sidewall that extends from an upstream end of the delivery tube to a downstream end of the delivery tube;
the cylindrical sidewall defines a plurality of apertures that are arranged in a radial pattern about the central axis;
each of the plurality of apertures is fluidly coupled with the purge gas plenum; and
each of the plurality of apertures is angled away from the central axis.

9. The semiconductor processing system of claim 8, wherein:
the plurality of apertures are arranged at regular intervals about a circumference of the delivery tube.

10. The semiconductor processing system of claim 8, wherein:
at least some of the plurality of apertures are angled downward toward the faceplate.

11. The semiconductor processing system of claim 8, wherein:
the purge gas plenum is characterized by an annular body that extends around an outer periphery of the delivery tube.

12. The semiconductor processing system of claim 8, wherein:
each of the plurality of apertures forms a lumen that extends from the purge gas plenum to an interior surface of the delivery tube.

13. The semiconductor processing system of claim 8, wherein: the faceplate is a first faceplate, the system further comprising a second faceplate; the purge gas plenum is a first purge gas plenum, the system further comprising a second purge gas plenum; the delivery tube is a first delivery tube, the system further comprising a second delivery tube; the second delivery tube extends between and fluidly couples the RPS and the second faceplate, wherein: the second delivery tube is characterized by a second central axis and a cylindrical sidewall; the cylindrical sidewall defines a second plurality of apertures that are arranged in a radial pattern about the second central axis; each of the second plurality of apertures is fluidly coupled with the second purge gas plenum; and each of the second plurality of apertures is angled away from the second central axis.

14. The semiconductor processing system of claim 13, wherein:
the second plurality of apertures are angled downward toward the second faceplate.

15. A semiconductor processing system, comprising:
a remote plasma source (RPS);
a faceplate;
an output manifold positioned between the RPS and the faceplate;
a delivery tube coupled with the RPS and extending between and fluidly coupling the RPS and the faceplate, wherein:
the delivery tube is characterized by a central axis and a cylindrical sidewall that extends to a downstream end of the delivery tube;
the cylindrical sidewall defines a plurality of apertures that are arranged in a radial pattern about the central axis;
the delivery tube comprises a top positioned above the plurality of apertures; and
the top is fluidly coupled with a purge gas source.

16. The semiconductor processing system of claim 15, wherein:
purge gas is flowed into the delivery tube via the RPS.

17. The semiconductor processing system of claim 1, wherein:
the upper plurality of apertures and the lower plurality of apertures have different diameters from one another.

* * * * *